(12) United States Patent
Alptekin et al.

(10) Patent No.: US 10,707,167 B2
(45) Date of Patent: Jul. 7, 2020

(54) CONTACTS TO SEMICONDUCTOR SUBSTRATE AND METHODS OF FORMING SAME

(71) Applicant: GLOBALFOUNDRIES INC., Grand Cayman (KY)

(72) Inventors: Emre Alptekin, Wappingers Falls, NY (US); Nicolas L. Breil, San Jose, CA (US); Christian Lavoie, Pleasantville, NY (US); Ahmet S. Ozcan, Chappaqua, NY (US); Kathryn T. Schonenberg, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 362 days.

(21) Appl. No.: 15/826,939

(22) Filed: Nov. 30, 2017

(65) Prior Publication Data
US 2018/0090447 A1   Mar. 29, 2018

Related U.S. Application Data

(62) Division of application No. 14/729,298, filed on Jun. 3, 2015, now Pat. No. 9,865,546.

(51) Int. Cl.
| | |
|---|---|
| *H01L 23/532* | (2006.01) |
| *H01L 21/768* | (2006.01) |
| *H01L 23/485* | (2006.01) |
| *H01L 21/285* | (2006.01) |

(52) U.S. Cl.
CPC .. *H01L 23/53266* (2013.01); *H01L 21/28518* (2013.01); *H01L 21/7684* (2013.01); *H01L 21/76843* (2013.01); *H01L 21/76846* (2013.01); *H01L 21/76855* (2013.01); *H01L 21/76879* (2013.01); *H01L 21/76883* (2013.01); *H01L 23/485* (2013.01); *H01L 21/2855* (2013.01); *H01L 23/53223* (2013.01); *H01L 23/53238* (2013.01)

(58) Field of Classification Search
None
See application file for complete search history.

(56) References Cited

U.S. PATENT DOCUMENTS

| | | | |
|---|---|---|---|
| 8,278,200 B2 | 10/2012 | Lavoie et al. | |
| 2012/0161324 A1 | 6/2012 | Heinrich et al. | |
| 2014/0027883 A1 | 1/2014 | Hu | |
| 2015/0220791 A1 | 8/2015 | Wu et al. | |
| 2015/0221740 A1* | 8/2015 | Alptekin | H01L 29/456 257/288 |

* cited by examiner

*Primary Examiner* — Fernando L Toledo
*Assistant Examiner* — Lawrence-Lin T Nguyen
(74) *Attorney, Agent, or Firm* — Anthony Canale; Hoffman Warnick LLC

(57) ABSTRACT

An aspect of the invention includes a method for forming a contact in a dielectric layer over a semiconductor substrate. The method may comprise: forming a contact opening in a dielectric layer over the semiconductor substrate to expose an upper portion of the semiconductor substrate; depositing a first liner layer to conformally coat the contact opening; causing a portion of the first liner layer to diffuse into the upper portion of the semiconductor substrate to form a first intermix region at the upper portion of the semiconductor substrate; depositing a refractory metal layer over the first intermix region; and depositing a metal in the contact opening thereby forming the contact.

6 Claims, 5 Drawing Sheets

CONTACTS TO SEMICONDUCTOR SUBSTRATE AND METHODS OF FORMING SAME

BACKGROUND

Technical Field

The present invention relates to contacts over a semiconductor substrate and methods of forming the same. More specifically, the present invention relates to forming an intermix region at an interface of a bottom portion of contacts and an upper portion of the semiconductor substrate, respectively.

Related Art

State of the art field effect transistors (FETs) can be fabricated by depositing a gate conductor over a gate dielectric and a semiconductor substrate. Generally, the FET fabrication process implements lithography and etching processes to define the gate structures. After providing the gate structures, source/drain extensions may be formed into a portion of the semiconductor substrate and on both sides of each gate structure by ion implantation. Sometimes this implant is performed using a spacer to create a specific distance between the gate structure and the implanted junction. Source and drain may be doped with a p-type or n-type dopant. The term "p-type" refers to the addition of impurities to an intrinsic semiconductor that creates deficiencies of valence electrons. "N-type" refers to the addition of impurities that contributes free electrons to an intrinsic semiconductor. After formation of the transistor, a set of contact openings may be created to expose the source and drain. The contact openings may be coated with a Ti-based silicide liner. Subsequently, contact openings may be filled with a metal material, such as W.

In a p-type FET (PFET), performance with a Ti-based silicide liner is a challenge for 14/10 nm silicon-on-insulator (14/10 SOI) technologies. In order to improve workfunction of Ti-based silicide in the source and drain of a PFET, a bilayer of NiPt and Ti has been employed to coat contact openings over the source and drain. However, this bilayer requires deposition of a relatively thick metal layer. As semiconductor devices get smaller, requiring a thick bilayer in the contact causes contact opening fill issues, such as an incomplete contact fill.

SUMMARY

A first aspect of the invention includes a method for forming a contact in a dielectric layer to a semiconductor substrate. The method comprises: forming a contact opening in the dielectric layer over the semiconductor substrate to expose an upper portion of the semiconductor substrate; a first liner layer to conformally coat the contact opening; causing a portion of the first liner layer to diffuse into the upper portion of the semiconductor substrate to form a first intermix region at the upper portion of the semiconductor substrate; depositing a refractory metal layer over the first intermix region; and depositing a metal in the contact opening thereby forming the contact.

A method for forming a set of contacts in a dielectric layer to a field effect transistor, the field effect transistor including a source, a drain, and a gate between the source and the drain. The method comprises: forming a contact opening in the dielectric layer to expose an upper portion of each of the source and the drain; depositing a first liner layer to conformally coat each contact opening and causing a portion of the first liner layer to diffuse into the upper portion of each of the source and the drain to form a first intermix region at the upper portion of the each of the source and the drain; depositing a refractory metal layer over the first intermix region; and depositing a metal to substantially coat the refractory metal layer and substantially fill each of the openings thereby forming the set of contacts.

A third aspect of the invention includes a semiconductor structure including a contact to a semiconductor substrate. The contact comprises: a contact opening in a dielectric layer over the semiconductor substrate; a first liner layer substantially coating a sidewall of the contact opening; a refractory metal layer substantially coating the first liner layer in the contact opening; a metal substantially filling the contact opening; and an intermix region at an upper portion of the semiconductor substrate in the contact opening, the intermix region having a composition including a material used in the first liner layer, a material used in the refractory metal layer, and a material used in the semiconductor substrate.

BRIEF DESCRIPTION OF THE DRAWINGS

The embodiments of this invention will be described in detail, with reference to the following figures, wherein like designations denote like elements, and wherein.

DETAILED DESCRIPTION

Aspects of the present invention utilize an intermix concept as a template for formation of a contact to a semiconductor substrate of a semiconductor structure. In some embodiments, the semiconductor structure may be a transistor, e.g., PFET or n-type FET (NFET) having a gate, a source, and a drain as is known in the art. In other embodiments, semiconductor structure may be a wire, a FinFet, or a hetero-bipolar junction transistor (HBT) or other silicon based microelectronic devices. One aspect of the present invention involves depositing a first liner layer in a contact opening such that an intermix region is formed at an interface of the bottom portion of the contact opening and an upper portion of the semiconductor substrate thereunder, e.g., source and drain. Unreacted (non-diffused) portions of the first liner layer may be removed prior to completion of fabricating the contact. Therefore, aspects of the present invention do not increase the deposited metal thickness in the contact openings. Thus, contact opening fill issues are avoided and overall contact resistance is improved.

Figure 1:
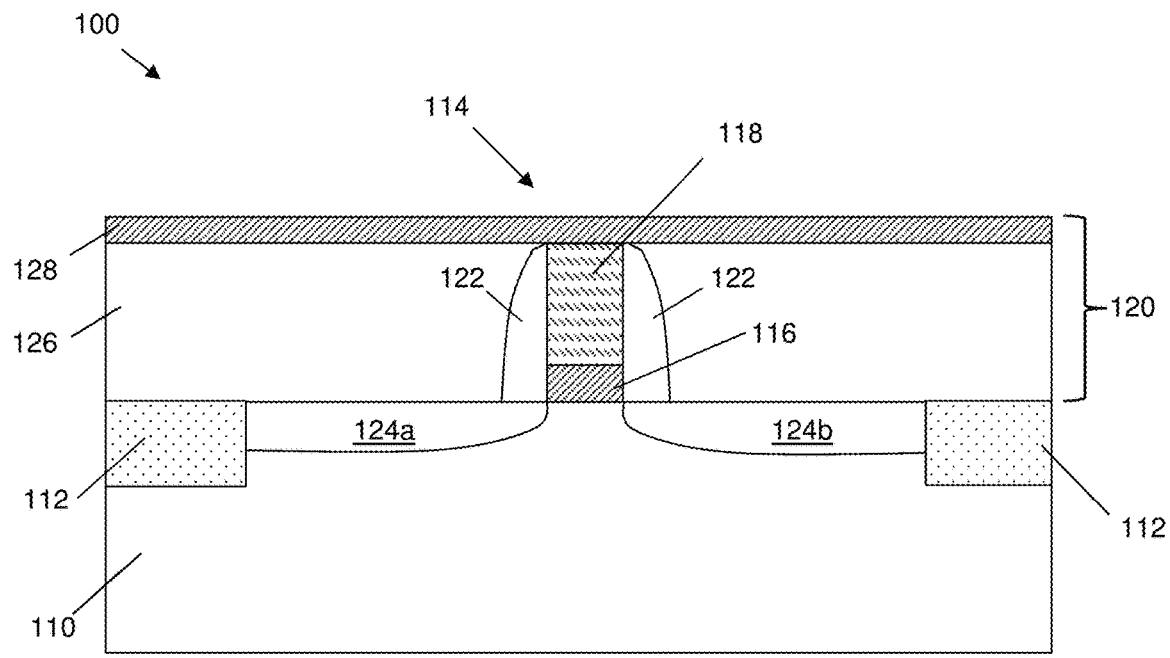
FIGS. 1-8 show cross-sectional views of a semiconductor structure undergoing processing according to embodiments of the invention.

Referring now to FIG. 1, a semiconductor structure 100 is shown including a semiconductor substrate 110, an isolation region 112, and a gate structure 114 within a dielectric layer 120 over substrate 112. Substrate 112 may be employed as a semiconductor layer of a semiconductor-on-insulator substrate (not shown), or a bulk substrate (not shown) as understood in the art. Substrate 112 may include any now known or later developed semiconductor material including but not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire substrate may be strained. Substrate 112 may be doped, undoped or contain doped and undoped regions therein.

In some embodiments of the invention, substrate 110 may include at least one isolation region 112 therein. Isolation region 112 may be a trench isolation region or a field oxide isolation region as is known in the art. A trench isolation region can be formed utilizing a conventional trench isolation process well known to those skilled in the art. For example, lithography, etching and filling of the trench with a trench dielectric such as an oxide may be used in forming the trench isolation region. Optionally, a liner may be formed in the trench prior to trench fill. After the trench is filled, a densification step may be performed as well as a planarization process. A field oxide isolation region may be formed utilizing a so-called local oxidation of silicon process. The at least one isolation region 112 may provide isolation between neighboring gate structures, typically required when the neighboring gate structures have opposite conductivities, i.e., n-type transistors and p-type transistors. As such, the at least one isolation region 112 can separate, for example, a first device region in which an n-type transistor device can be formed and second device region in which a p-type transistor device can be formed.

Further, FIG. 1 illustrates that a gate 114 may be formed on substrate 112. Gate structure 114 may include a gate dielectric material 116 and a gate conductor 118. Gate structure 114 may be used to control output current of the semiconducting device through electrical or magnetic fields. Gate dielectric 116 may include, but is not limited to: $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a dielectric metal oxide can be formed and used as gate dielectric material 116. Gate conductor 118 may include, but is not limited to: doped polysilicon, doped silicon germanium, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), or multilayered combinations thereof.

Gate structure 114 may be formed by depositing gate dielectric 116 on substrate 112. As used herein, "depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. Additionally, subsequent to the deposition of gate dielectric 116, gate conductor 118 can be deposited on gate dielectric 116. The precise thickness of gate dielectric 116 and gate conductor 118 may vary widely with the intended application.

Gate dielectric 116 and gate conductor 118 can be patterned into a functional gate structure 114. Gate structure 114 can be formed by lithography and etching. Lithography can include forming a photoresist (not shown) on the topmost surface of gate conductor 118 exposing the photoresist to a desired pattern of radiation, and then developing the exposed photoresist with a resist developer to provide a patterned photoresist atop the gate conductor 118. At least one etch is then employed which transfers the pattern from the patterned photoresist into the various materials. As used herein, "etching" may include any now known or later developed techniques appropriate for the material to be etched including but not limited to, for example: isotropic etching, anisotropic etching, plasma etching, sputter etching, ion beam etching, reactive-ion beam etching and reactive-ion etching (RIE).

Still referring to FIG. 1, a spacer 122 may be formed on each sidewall of gate 114. Spacers 122 may be formed by depositing a spacer material and etching the spacer material. Spacers 122 may include a spacer dielectric material as is known in the art, such as, but not limited to: a dielectric oxide, dielectric nitride, and/or dielectric oxynitride. Additionally, a source 124a and drain 124b may be formed in a portion of substrate 110 on either side of gate 114. In some embodiments, a source extension region and a drain extension region (not separately shown) may be formed prior to forming spacer 122 utilizing an extension ion implantation process. As such, a portion of each of the source extension region and the drain extension region would be located beneath the spacer 122. After forming the spacers 122, source 124a and drain 124b are formed utilizing a source/drain ion implantation process. An activation anneal may follow the implantation processes. Source 124a (including the corresponding source extension region) and drain 124b (including the corresponding drain extension region) may be doped with a p-type or n-type dopant. The term "p-type" refers to the addition of impurities to an intrinsic semiconductor that creates deficiencies of valence electrons. In a silicon-containing substrate, examples of p-type dopants, i.e., impurities, include, but are not limited to, boron, aluminum, gallium and indium. "N-type" refers to the addition of impurities that contributes free electrons to an intrinsic semiconductor. In a silicon-containing substrate, examples of n-type dopants, i.e., impurities, include, but are not limited to, antimony, arsenic and phosphorus. The concentration of dopants within source 124a (and the corresponding source extension region) and drain 124b (and the corresponding drain extension region) can be within ranges known in the art.

Still referring to FIG. 1, a dielectric layer 120 may be formed such that dielectric layer 120 substantially surrounds gate 114. In one embodiment of the invention, formation of dielectric layer 120 may include deposition of a dielectric material 126 and a dielectric cap material 128. While shown as two separate layers, it is to be understood that dielectric layer 120 is not limited to only two layers. Rather, in other embodiments of the invention, dielectric layer 120 may include a single layer or more than two separate layers. Dielectric material 126 may include, but is not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. The upper surface of gate 114 is exposed immediately after depositing dielectric material 126. In some embodiments, a planarization process or an etch back process follows the deposition of the dielectric material 126. As is illustrated, dielectric material 126 may have an upper surface that is coplanar with an upper surface of gate 114. Dielectric material 126 may have a bottom surface that contacts an upper surface of source 124a, an upper surface of the drain 124b, and an upper surface of insolation regions 112. The thickness of the dielectric material 126 that can be employed in the present application may vary depending on the type of dielectric material employed as well as the method that was employed in forming the same. In one embodiment, dielectric material 126 has a thickness from 80 nm to 500 nm. Other thicknesses that are greater or lesser than the range provided above can also be used for dielectric material 126.

Subsequently, dielectric cap material 128 may be deposited on dielectric material 126. Dielectric cap material 128 may include an insulator material that differs from dielectric material 126. Examples of insulator materials that can be used as dielectric cap material 128 include, for example, silicon dioxide, silicon nitride and silicon oxynitride. Dielectric cap material 128 may have a thickness from 1 nm to 20 nm. Other thicknesses can also be used for the thickness of the dielectric cap material 128.

Figure 2:
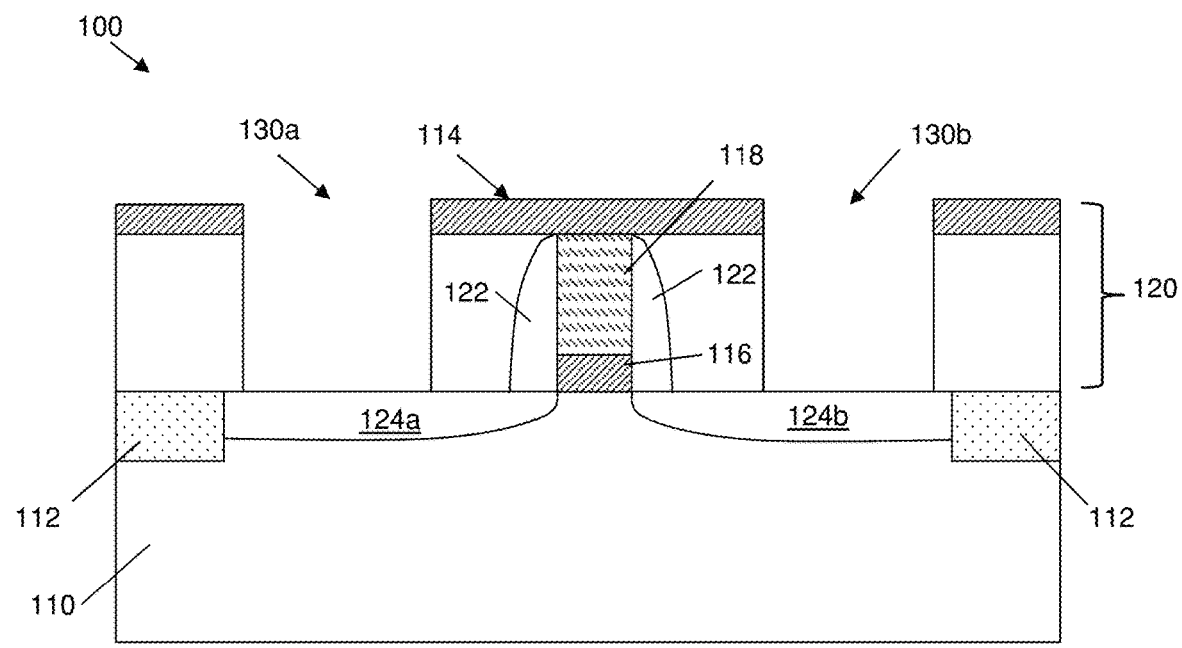

As shown in FIG. 2, a plurality of contact openings 130a, 130b may be formed in a dielectric layer 120 to substrate 110. That is, contact openings 130a, 130b may be formed through dielectric cap material 128 and dielectric material 126 to expose source 124a and drain 124b. For example, contact opening 130a exposes source 124a, while contact opening 130b exposes drain 124b. Contact openings 130a, 130b can be formed by lithography and etching. Portions of dielectric material 126 and dielectric cap material 128 remain on the upper surfaces of gate 114. As is shown in the drawings of the present application, a portion of dielectric cap material 128 that is located on the upper surface gate structure 114 may extend beyond the edges of gate structure 114 and beyond an outermost edge of each spacer 122. Further, dielectric cap material 128 and dielectric material 126 that are present above isolation regions 112 extend beyond the outermost edges of isolation regions 112. In some embodiments, plurality of openings 130a, 130b have a width (measured from one exposed sidewall of one portion of dielectric material 126 to another exposed sidewall of another portion of dielectric material 126) of from 10 nm-50 nm. Other widths that are greater or lesser than the aforementioned widths can also be used in the present application.

Figure 3:
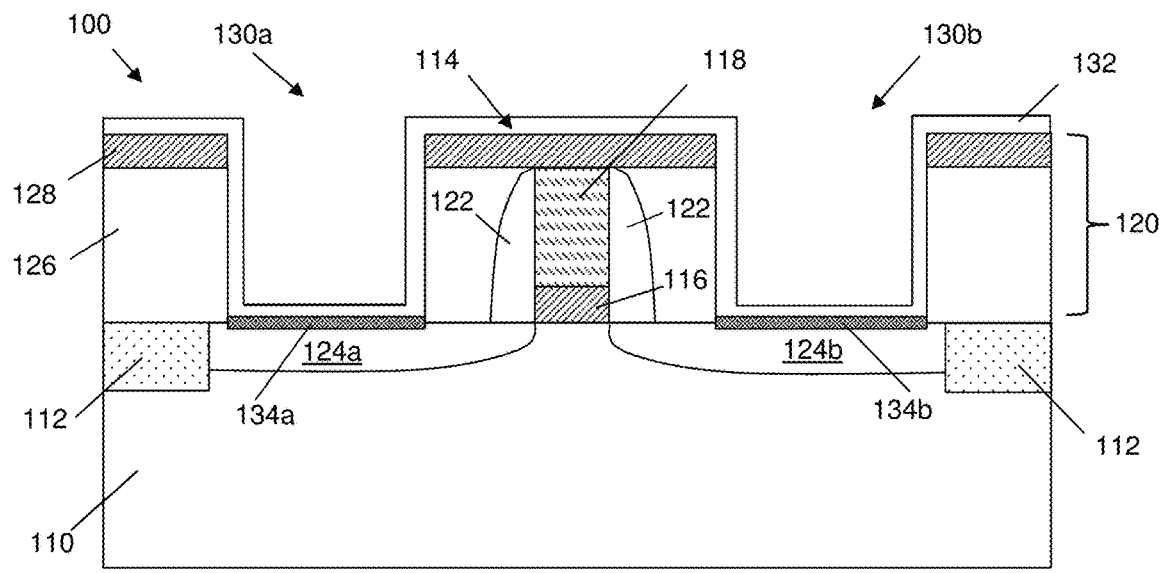

As shown in FIG. 3, a first liner layer 132 may be deposited to conformally coat each contact opening 130a, 130b and substantially cover dielectric cap material 128. First liner layer 132 may be deposited using ionized PVD or radio frequency PVD (RFPVD) or other directional energetic thin film deposition techniques such as Ion beam assisted deposition, performed at room temperature or above. First liner layer 132 may include, but is not limited to, at least one of: NiPt, Ni, Ti, TiSi, Co, Er, Pt, and Yb. First liner layer 132 may be deposited such that a first intermix region 134a, 134b is formed at an interface of the bottom portion of each contact opening 130a, 130b and the upper portion of each of source 124a and drain 124b.

First intermix regions 134a, 134b may originate from the high energy of the incoming sputtered atoms (from first liner layer 132) which are thus pushed into the Si lattice of source 124a and drain 124b. Therefore, first intermix regions 134a, 134b may include a mixture of the material used for first liner layer 132 and a material used for the respective semiconductor substrate 110 thereunder. In the embodiment shown in FIG. 3, first intermix regions 134a, 134b may have a composition including a material used for first liner layer 132 and materials used for the respective source and drain 124a, 124b thereunder. While the Si lattice is a dense way to pack Si atoms, it has a relatively open structure due to its bonding being covalent. The first few metal atoms, arriving with relatively high energy, can be forced into the interstitial sites of the Si lattice to create a thin region (intermix regions 134a, 134b) of mixed Si and metal on the order of 3-5 nm in thickness, for example. In some cases, first intermix region 134a, 134b may have a relatively high Si content (greater than 50% Si in atomic composition). In other embodiments, the compositions of first intermix regions 134a, 134b may vary depending on one or more factors including, but not limited to: the type of material being deposited, the composition of source 124a and drain 124b, the energy of the atoms of the material being deposited, and/or the conditions of the deposition technique (temperature, pressure, reaction, atmosphere, etc.). In some embodiments, it may be desirable to select a target composition of first intermix regions 134a, 134b in view of one or more criteria, e.g., etch selectivity. First intermix region 134a, 134b may be amorphous and a subsequent anneal may crystallize intermix region 134a, 134b into a lower resistance layer as will be described herein.

First intermix regions 134a, 134b allow for formation of a very thin contact layer that is normally very difficult to control with standard sputtering tools. First intermix regions 134a, 134b are much more conformal on Si structures that are not planar. Additionally, upon annealing of first intermix regions 134a, 134b (which will be described further herein), very little if any metal diffusion is needed to form the low resistance contact layer which is often a source of defects in small devices. Encroachment of silicide under spacers 122 and encroachment on defective silicon areas may be substantially reduced or eliminated by this intermixing concept, thus increasing the yield of semiconductor structures or devices.

Figure 4:
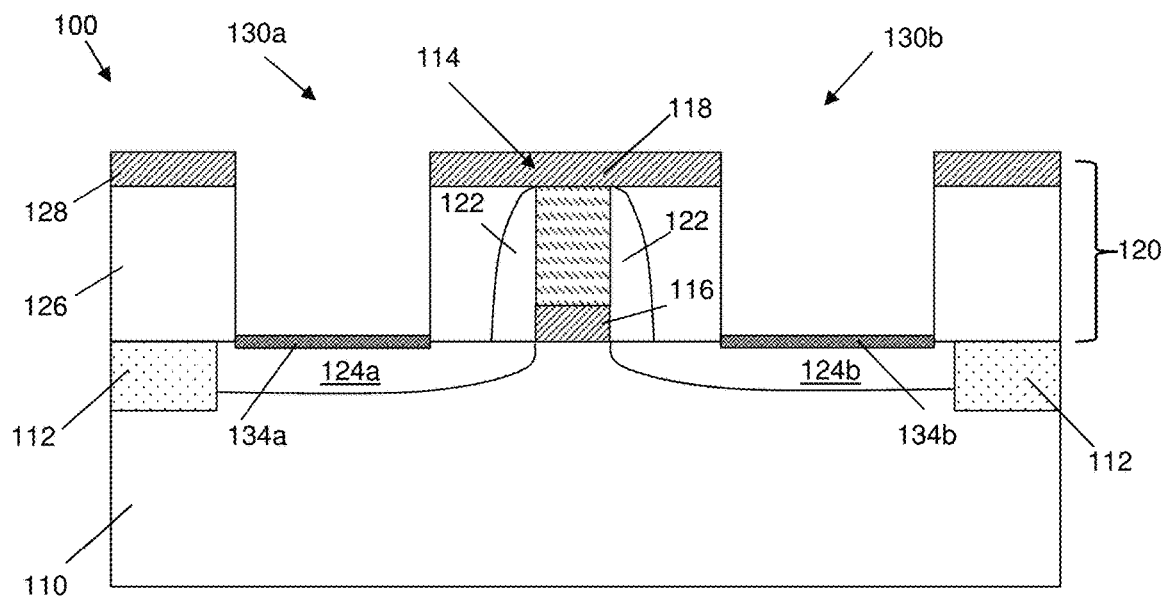

Referring now to FIG. 4, another step of the method according to embodiments of the invention is shown. In this step, first liner layer 132 is removed from each contact opening 130a, 130b as well as from the upper surface of dielectric cap material 128. That is, the remaining portion of first liner layer 132 which does not diffuse into the respective source 124a and drain 124b is removed. First liner layer 132 may be removed by etching using one of the various etching techniques previously described. In some embodiments, first liner layer 132 may be removed by an aqua regia etch process. Aqua regia etching is a wet etch process and involves providing a solution of hydrochloric and nitric acids to the surfaces to be etched. First liner layer 132 may be removed such that intermix regions 134a, 134b are exposed at the bottom portion of contact openings 130a, 130b.

Figure 5:
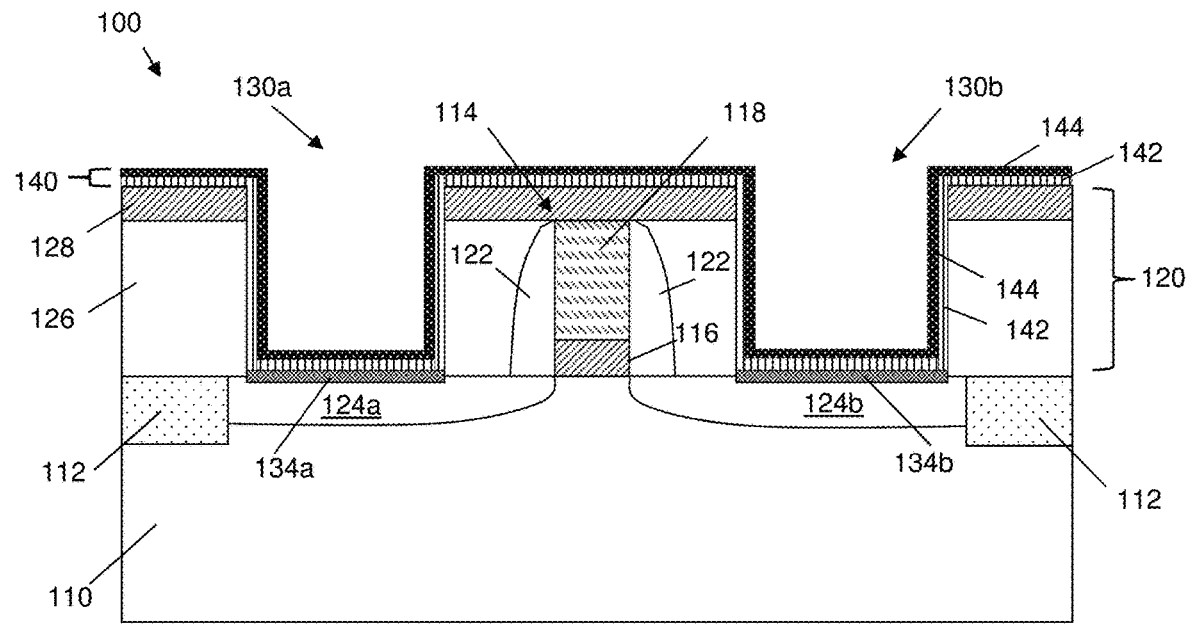

As shown in FIG. 5, another aspect of the method according to embodiments of the invention is shown to include depositing a refractory metal layer 140 to conformally coat each contact opening 130a, 130b and substantially cover dielectric cap material 128 and first intermix regions 134a, 134b at the bottom portion of each contact opening 130a, 130b. Refractory metal layer 140 may include, but is not limited to: W, Ti, Ta or Mo employed directly as a "metal"; a refractory metal employed as a constituent of a "compound" thereof, e.g., TiN, TaN, etc.; or even as a constituent of an "alloy" with another metal, e.g., titanium-tungsten. In some embodiments, as shown in FIG. 5, refractory metal layer 140 may include a bilayer of a first refractory material 142 and a second refractory material 144 such that first refractory metal material 142 substantially separates first liner layer 132 from second refractory metal layer 144. First and second refractory metal materials 142, 144 may include any of the refractory metal materials previously mentioned. For example, in some embodiments, first refractory metal material 142 may include Ti and second refractory metal material 144 may include TiN. In this example, first refractory metal material 142 may be deposited using RFPVD and second refractory metal material 144 may be deposited using ALD. While shown as a bilayer, it is to be understood that refractory metal layer 140 may include any number of layers of refractory metal materials without departing from aspects of the invention.

Figure 6:
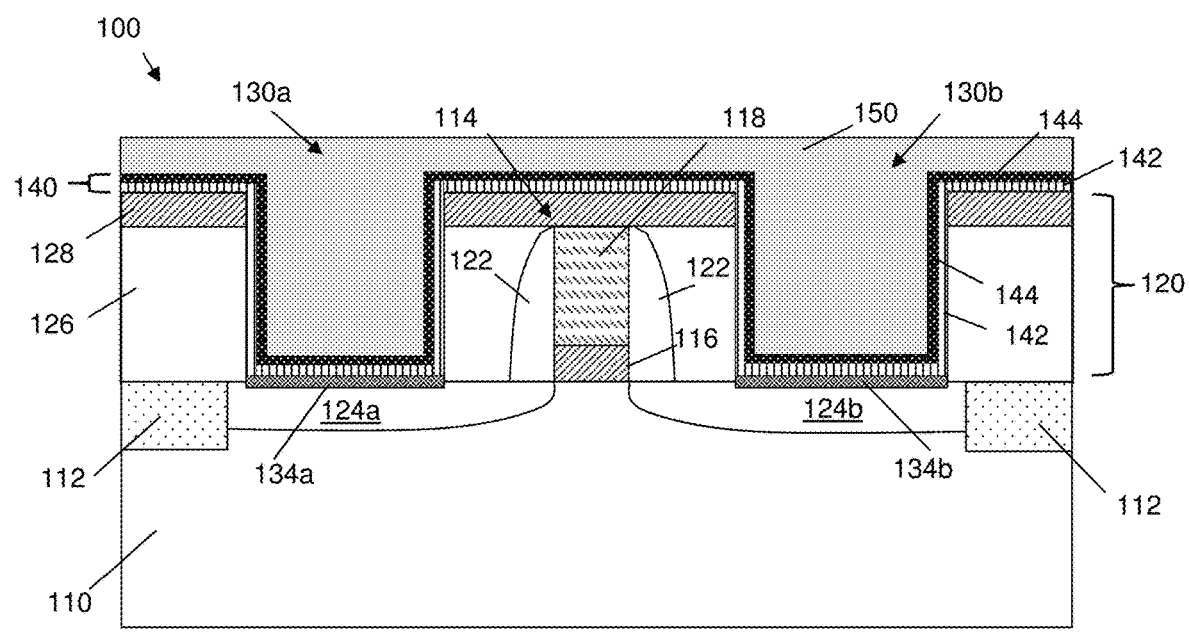
Figure 7:
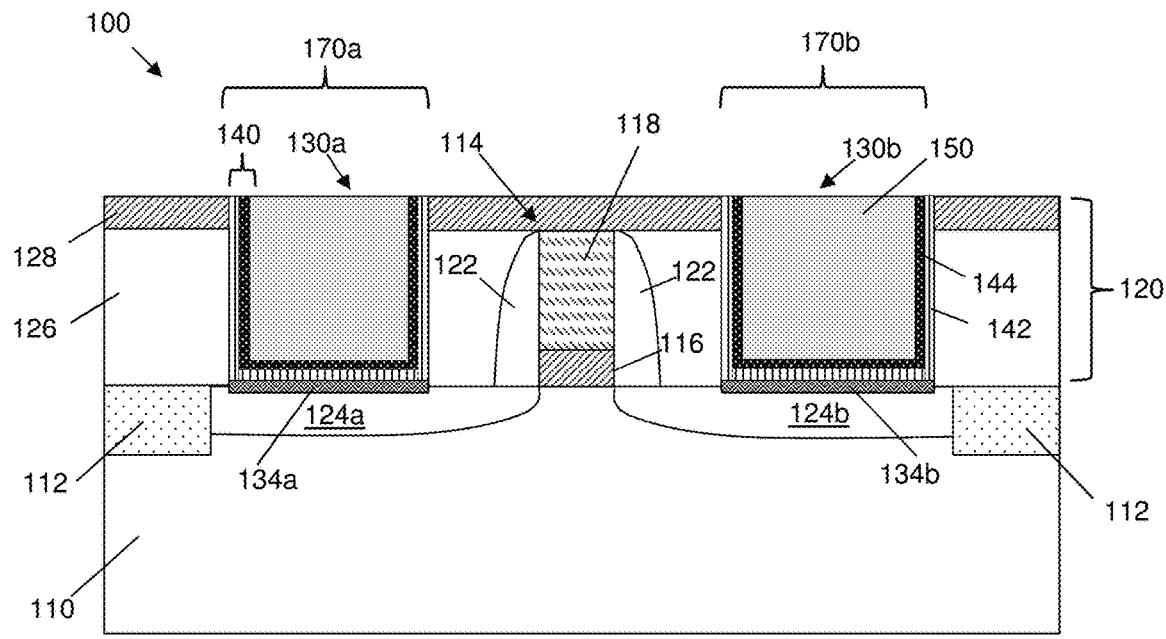

Referring now to FIG. 6, a metal 150 may be deposited over dielectric cap material 128 and within each contact opening 130a, 130b to substantially coat refractory metal layer 140 therein and substantially fill contact openings 130a, 130b. Alternatively, a plating process that fills each contact opening 130a, 130b from the bottom upwards can be used. In an embodiment of the invention where refractory metal layer 140 includes a bilayer, second refractory metal material 144 may substantially separate first refractory metal material 142 from metal layer 150. Metal layer 150 may include, but is not limited to: W, Co, Cu, and Al. As shown in FIG. 7, semiconductor structure 100 may undergo a planarization process such as, for example, chemical mechanical polishing (CMP) to create contacts 170a, 170b within contact openings 130a, 130b. During the planarization process, portions of refractory metal layer 140 and metal layer 150 that extend beyond the upper surface of dielectric cap material 128 are removed such that refractory metal layer 140 and metal layer 150 within contact openings 130a, 130b are coplanar with the upper surface of dielectric cap material 128.

In one example, contacts 170a and 170b may include NiPt as first liner layer 132, a Ti/TiN bilayer as refractory metal layer 140, and W as metal 150. In this embodiment, first intermix regions 134a, 134b may include a NiPt silicide and second intermix regions 154a, 154b may include a NiPtTi silicide. However, it is to be understood that other combinations of materials may be used to create contacts 170a, 170b without departing from aspects of the invention. For example, in another embodiment, first liner layer 132 may include Ni, refractory metal layer 140 may include a Ti/TiN bilayer, and metal 150 may include W. In this embodiment, first intermix regions 134a, 134b may include a Ni silicide and second intermix regions 154a, 154b may include a NiTi silicide.

Figure 8:
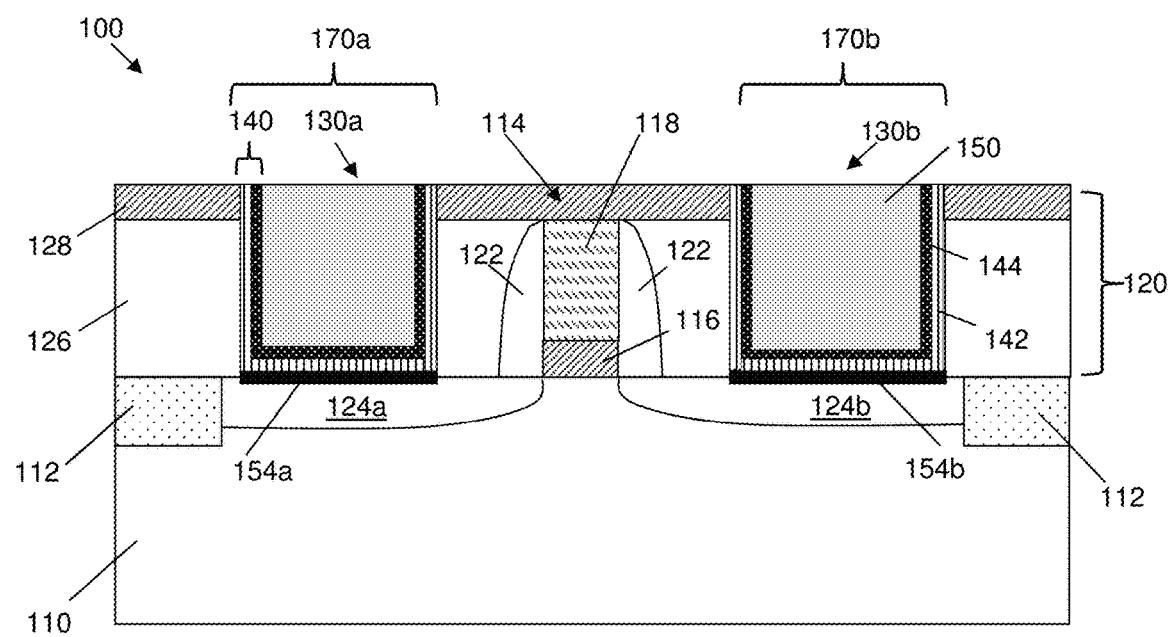

As shown in FIG. 8, a laser anneal process may be performed such that a second intermix region 154a, 154b is formed at the interface of the bottom portion of contacts 170a, 170b and upper portion of source 124a and drain 124b. Second intermix regions 154a, 154b may have a thickness of 3-5 nm. The laser anneal process may transform the composition of first intermix region 134a, 134b (FIGS. 3-7) into a second composition resulting in second intermix region 154a, 154b in place of first intermix region 134a, 134b. That is, the laser anneal process may crystallize intermix regions 134a, 134b into a lower resistance layer, i.e. a second intermix region 154a, 154b. Second intermix regions 154a, 154b may have compositions including a mixture of the materials used for source 124a and drain 124b, first liner layer 132, and refractory metal layer 140. In an embodiment where Ti is used as refractory metal layer 140, second intermix region 154a, 154b may be a silicide, such as but not limited to: TiSi, NiSi, or NiPtTiSi. That is, during the laser anneal process, refractory metal 140 may diffuse into first intermix regions 134a, 134b (FIGS. 3-7) to create second intermix regions 154a, 154b. The laser anneal process may be performed at temperature of approximately 700° C.-1100° C. for between approximately 0.1 milliseconds to approximately 1 millisecond. More particularly, the laser anneal process may be performed at approximately 800° C. for approximately 0.25 milliseconds. In some embodiments, the anneal temperature and duration may be dependent on the materials being used. In one embodiment, the anneal can utilize a laser having an energy from 500 watts to 2000 watts. In another embodiment, the anneal can be performed utilizing a raster scan beam size of from 1 cm long to 100 microns wide. In one example, the anneal can be performed utilizing a 10.6 micron $CO_2$ laser. In order to promote the efficiency of the $CO_2$ laser coupling with the semiconductor substrate, a laser with a shorter wavelength (e.g., InGaAs laser at 880 nm) can be used in conjunction with the $CO_2$ laser.

Figure 9:
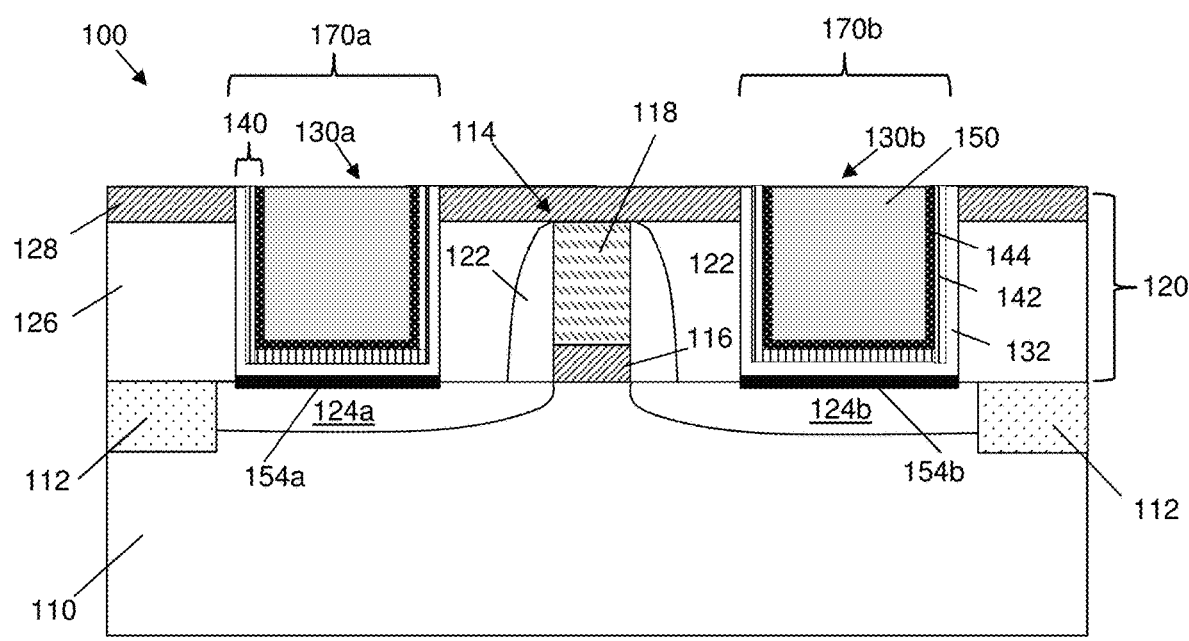
FIG. 9 shows a cross-sectional view of another embodiment of the semiconductor structure according to embodiments of the invention.

Referring now to FIG. 9, another embodiment of the invention is shown. In this embodiment, first liner layer 132 is not removed prior to depositing refractory metal layer 140. In this embodiment, first liner layer 132 is deposited as described with respect to FIG. 3, such that the deposition of first liner layer 132 creates first intermix region 134a, 134b. However, after deposition of first liner layer 132, refractory metal layer 140 is deposited as described with respect to FIG. 5. While refractory metal layer 140 is shown as a bilayer, refractory metal layer 140 may include any number of layers of refractory metal materials, as previously discussed. Further, this embodiment also includes etching refractory metal layer 140 from the upper surface of dielectric cap layer 128 such that a portion of refractory metal layer 140 remains substantially coating the sidewalls of contact openings 130a, 130b and first intermix regions 134a, 134b at the bottom portion of contact openings 130a, 130b as described with respect to FIG. 6. Additionally, a metal layer 150 may be deposited and polished as described with respect to FIGS. 6-7. Lastly, this embodiment may also undergo the laser anneal process to create second intermix regions 154a, 154b as described with respect to FIG. 8. Second intermix regions 154a, 154b may include a mixture of the materials used for source and drain regions 124a, 124b, first liner layer 132, and refractory metal layer 140. This embodiment allows for a higher quantity of first liner layer 132 in contacts 170a, 170b due to the remaining portions of first liner layer 132 on sidewalls of contact openings 130a, 130b. Additionally, this embodiment results in a simpler process as the step of removing liner layer 132 is not performed, and therefore selectivity may not be a problem.

Contacts 170a, 170b of this embodiment may include NiPt as first liner layer 132, a Ti/TiN bilayer for refractory metal layer 140, and W as metal 150. In this embodiment, first intermix regions 134a, 134b may include NiPt silicide and second intermix regions 154a, 154b may include a NiPtTi silicide. Alternatively, first liner layer 132 may include Ti, refractory metal 140 may include TiN, and metal 150 may include W. In this embodiment, first intermix region 134a, 134b may include TiSi and second intermix region 154a, 154b may include TiSi with a higher concentration of Ti.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A semiconductor structure including a contact to a semiconductor substrate, the contact comprising:
    a contact opening in a dielectric layer over the semiconductor substrate;
    a first liner layer substantially coating a sidewall of the contact opening;
    a refractory metal layer substantially coating the first liner layer in the contact opening;
    a metal substantially filling the contact opening; and
    an intermix region at an upper surface of the semiconductor substrate in the contact opening, the intermix region having a composition including a material used in the first liner layer, a material used in the refractory metal layer, and a material used in the semiconductor substrate;
    wherein the refractory metal layer includes a multi-layer having at least a first refractory metal material and a second refractory metal material, the first refractory metal material substantially separating the first liner layer and the second refractory metal material, the second refractory metal material substantially separating the first refractory metal material and the metal.

2. The contact of claim 1, wherein the intermix region includes a titanium-based silicide.

3. The contact of claim 1, wherein the first liner layer includes titanium (Ti) and the refractory metal layer includes titanium nitride (TiN).

4. The contact of claim 1, wherein the first liner layer includes nickel platinum (NiPt), the first refractory metal material includes titanium (Ti) and the second refractory metal material includes titanium nitride (TiN).

5. The contact of claim 1, wherein the metal includes tungsten (W).

6. The contact of claim 1, wherein the intermix region has a thickness of approximately 3 nanometers to approximately 5 nanometers.

* * * * *